(12) United States Patent
Volle

(10) Patent No.: US 6,385,503 B2
(45) Date of Patent: *May 7, 2002

(54) REACTOR FOR THE PROCESSING OF WAFERS, WITH A PROTECTION DEVICE

(75) Inventor: Wolfgang Volle, Holzgerlingen (DE)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/097,977

(22) Filed: Jun. 16, 1998

(30) Foreign Application Priority Data

Jun. 17, 1997 (DE) .......................... 197 25 527

(51) Int. Cl.$^7$ ............................. G06F 17/00; G06F 7/00; G07F 7/00
(52) U.S. Cl. ........................ 700/218; 700/56; 700/213; 318/640; 414/217; 414/935; 414/937; 414/939; 414/940
(58) Field of Search ........................... 700/218, 56, 213; 29/25.01; 318/640, 568.16; 414/217, 217.1, 937, 939, 940, 941, 935, 936, 416, 938

(56) References Cited

U.S. PATENT DOCUMENTS

| 4,705,951 A | * 11/1987 | Layman et al. ........ 250/442.11 |
| 4,819,167 A | 4/1989 | Cheng et al. ................ 364/167 |
| 5,166,754 A | * 11/1992 | Suzuki et al. ................ 356/401 |
| 5,239,182 A | * 8/1993 | Tateyama et al. ....... 250/559.37 |
| 5,483,138 A | * 1/1996 | Shmookler et al. ..... 318/568.16 |
| 5,539,323 A | * 7/1996 | Davis Jr. ..................... 324/690 |
| 5,563,798 A | 10/1996 | Berken et al. .............. 364/478 |
| 5,606,251 A | * 2/1997 | Ryle et al. ................ 324/158.1 |
| 5,740,062 A | * 4/1998 | Berken et al. ......... 364/478.06 |
| 5,882,165 A | * 3/1999 | Maydan et al. ............. 414/217 |
| 5,980,194 A | * 11/1999 | Volle .......................... 414/754 |

* cited by examiner

Primary Examiner—Ayaz Sheikh
Assistant Examiner—Frantz B. Jean
(74) Attorney, Agent, or Firm—Aaron Waxler

(57) ABSTRACT

The invention relates to a reactor (1) for processing wafers (7) comprising at least one process chamber (5), at least one transport chamber (2) with a transport robot (3) for the wafers (7), and at least one magazine (6) for wafers (7) with a lifting mechanism (12). To safeguard a better protection against damage also for wafers (7) stored in a magazine (6), an optical detection device (13, 14, 15, 16) is provided in the reactor (1) for monitoring the position of the wafers (7) stored in a magazine (6). All wafers stored one above the other in a magazine (6) with several compartments can thus be monitored, for example by means of a simple photoelectric barrier (13, 15). It is possible in this manner to monitor not only those wafers (7) which were just previously taken out or put in by the transport robot (3), but also all other wafers (7) present in the magazine (6).

7 Claims, 2 Drawing Sheets

REACTOR FOR THE PROCESSING OF WAFERS, WITH A PROTECTION DEVICE

BACKGROUND OF THE INVENTION

The invention relates to a reactor for processing wafers comprising at least one process chamber, at least one transport chamber with a transport robot for the wafers, and at least one magazine for wafers with a lifting mechanism.

Known devices for processing semiconductors usually consist of a reactor with several process chambers and one transport chamber. A loading and unloading unit is coupled thereto. The semiconductor slices (or wafers) are taken from a storage unit comprising a magazine for a plurality of wafers and a lifting mechanism by means of a transport robot which is arranged in the transport chamber, and are loaded via the transport chamber into one of the process chambers. The robot loads the wafers consecutively into several process chambers in which the wafer is exposed to different processes. The process chambers are accordingly simultaneously occupied by different wafers which are stored again in the magazine of the storage unit between two processes (for example, if a process chamber is occupied) or after the final process. Since a vacuum atmosphere obtains in the entire reactor, and the individual chambers can be closed by means of valves, these processes can run automatically without a wafer entering the atmosphere.

U.S. Pat. No. 4,819,167 describes a system and a method for the recognition of the center of a circular semiconductor wafer for the manufacture of integrated circuits (wafer 15). The exact position of a moving object (wafer) can be determined by a robot during transport so as to support the accuracy of this movement. Several sensors (see, for example, 61–66 in FIG. 3 and the accompanying description) are provided for determining the relative position of the wafer, which is present on a movable support which follows a given path, with respect to a chosen point to which the support with the wafer is being moved. The sensors are triggered by starting and end points of the wafer and supply corresponding signals. The position is calculated from these signals. In particular, the position of a moving wafer with respect to an internal storage unit with a magazine with lifting mechanism (internal storage elevator 19) is determined by means of an arrangement of several optical sensors which are positioned transversely to the direction of movement. The sensors are fastened to an entry slot inside a transport chamber so as to form a row perpendicular to the direction of movement of the support (vacuum loadlock chamber 11, cf. e.g. ref. no. 47 in FIGS. 1, 2, 3 and 5), in which chamber the internal storage unit is present. To find the center of the wafer, several sensors are necessary, on whose signals a complicated calculation is then carried out. In addition, the position of the wafer is determined up to the internal storage unit only during the transport by means of the support. The system described is only capable of ensuring that the wafer will be in a given position relative to the support when it is on the support (column 1, lines 35–55).

Furthermore, U.S. Pat. No. 5,563,798 describes a wafer positioning system for an automated wafer processing installation (reactor) with several process chambers (processing chambers 6). The position of the wafer (10) is determined here in that the position of a wafer transport robot (18) is identified while the wafer is being moved thereby. Sensors are provided for this purpose on a transparent cover of a centrally arranged transport chamber (transfer chamber 16). The light beams of the optical sensors then passes through the cover and the transport chamber to reflectors provided on the bottom thereof, which reflect the beam back. A detector in the sensor recognizes the interruption of the light beam by a wafer which is being moved through the transport chamber. The position of the wafer transport robot is then measured on the basis of at least two measured values and is corrected if a deviation from the correct position of the wafer transport robot is detected. To achieve this, the position of the wafer is calculated from the measured values in an intricate calculation, and the deviation from the correct position is compensated by a linear and rotational adjustment of the wafer transport robot. The object of this is to achieve that the wafer transport robot transports the wafer correctly into its next position inside the reactor.

Methods and devices according to the present art have the disadvantage that only the position of the wafer being transported at a given moment can be observed, checked, and corrected, as applicable. In addition, at most a check for the moment of the measurement can be made in that way. Corrective adjustment quantities for the transport robot must be calculated from the measurement results, which quantities again are valid for the moment only, if no further, inadvertent movements of the wafer take place. However, it is quite possible for a disturbance of wafers to take place, in particular of those which are deposited in an internal or external storage unit in a magazine. For example, translatory movements of the external storage unit can shift the deposited wafers in the case of a magazine exchange, whereupon these wafers may be destroyed by the lifting mechanism in a subsequent vertical or horizontal adjustment of the magazine.

SUMMARY OF THE INVENTION

It is accordingly an object of the invention to provide a device which ensures a better protection against damage also of wafers which are stored in a magazine.

This object of the invention is achieved in that an optical detection device is provided in the reactor for monitoring the positions of the wafers stored in a magazine. The optical detection device, which may comprise in particular a photoelectric barrier formed by a transmitter (LED) and a receiver (photodiode), is provided inside the reactor according to the invention. Given a suitable arrangement, all wafers stored therein in a magazine with several superimposed compartments can thus be monitored. It is possible in this manner to monitor not only the wafers which were just taken out or put in by the transport robot but also all other wafers present in the magazine. If a wafer in the magazine has a shifted position, the operation of the lifting mechanism would lead to damage of the wafer if the distance to the wall is too small. This is true in particular if the wafer is moved from a wider into a narrower region. Since especially the previously deposited wafers may become shifted through shocks caused by frequent loading, unloading, and displacing of the magazine, a check of these wafers is of major importance. This is true in particular when several magazines are present which may be utilized consecutively. Damage may additionally arise then when the magazine is displaced. A limitation of the position monitoring to that wafer which is being moved by the transport robot at any given moment leads to frequent wafer damage and is accordingly insufficient. It is only a detection device according to the invention which provides a reliable monitoring also of those wafers whose processing in the reactor has been completed. These wafers are usually stored in a magazine which is not coupled to the transport chamber at that moment, but which is held ready for being taken from the reactor. Damage is particularly disadvantageous economically because an expensive process has been completed here. It should be noted in this connection that the damage to a wafer usually causes subsequent damage to other wafers in the relevant magazine caused by chipped fragments.

Preferred embodiments of the invention are indicated in claims 2 and 3. A particularly suitable protection against damage is formed by a check of whether a minimum distance is maintained between the wafer and a housing wall surrounding the magazine. The detection device switches to an alarm state the moment one of the deposited wafers passes below the minimum distance. The alarm state may be achieved, for example, by the interruption of the light beam of a photoelectric barrier, which will then have a different output signal. In any case, it will differ unequivocally from a normal operational state in which the detection takes place and in which no incorrect position is detected. Damage occurs most of all when a deposited wafer, which has shifted from its correct position, is moved together with the magazine from a wider range in the storage unit into a narrower range, and then collides with the housing wall. Accordingly, the optical detection device is advantageously provided against the housing wall which is closest to the magazine, in a narrow range of the volume in which the magazine movement takes place. The detection mechanism is not triggered as long as no wafer in the magazine has erred from its correct position. The magazine can be transported upward or downward, or horizontally for changing the magazine, by the lining mechanism without damage taking place. If a wafer has shifted so far that it projects from the magazine and comes to within the minimum distance to the wall, which can be set by means of a suitable fastening of the detection device, the detection signal is triggered. It is possible then in particular to block the lifting mechanism by which a projecting wafer would otherwise be damaged when it is moved from a wider into a narrower range.

An embodiment of the invention as defined in claim 4 has the advantage that the photoelectric barriers in this manner monitor the sides of the magazine where the wafers are moved into and from the magazine. These are preferential locations for shifts in position, which would remain unnoticed on account of the greater distances to the housing walls. These sides, accordingly, are particularly in danger as regards wafer damage during transport by the lifting mechanism.

A further development of the invention is indicated in claims 5 and 6. The processing unit receives the detection signal and generates one or several corresponding control signals. The relevant control signal is supplied to a control unit of the reactor which is in charge of the automatic process sequence. It is possible in this manner to influence directly the control of the reactor in order to take countermeasures in the alarm state of the detection device, for example switching-off of the drive motors for the lifting mechanism. The processing unit in addition takes into account further information such as, for example, the position of the transport robot, which could also trigger the alarm during taking out or inserting of a wafer. If a detection signal comes from several photoelectric barriers, several control signals will be given in dependence on the component signals which each comprise the information about the interruption of the light beam. Preferably, a warning lamp may be switched on in the case of a slight displacement of a wafer, whereas the control signal for switching the drive motors off is not given except in case of a critical displacement. In addition, an acoustic and/or optical warning signal may then be advantageously given in the vicinity of the reactor and in a higher process control unit. The process control is formed, for example, by a computer which is connected to several individual production units via a local area network (LAN).

BRIEF DESCRIPTION OF THE DRAWING

An embodiment of the invention will be explained in more detail below with reference to the drawing, in which.

DETAILED DESCRIPTION OF THE PREFERRED EMBODIMENT

Figure 1:
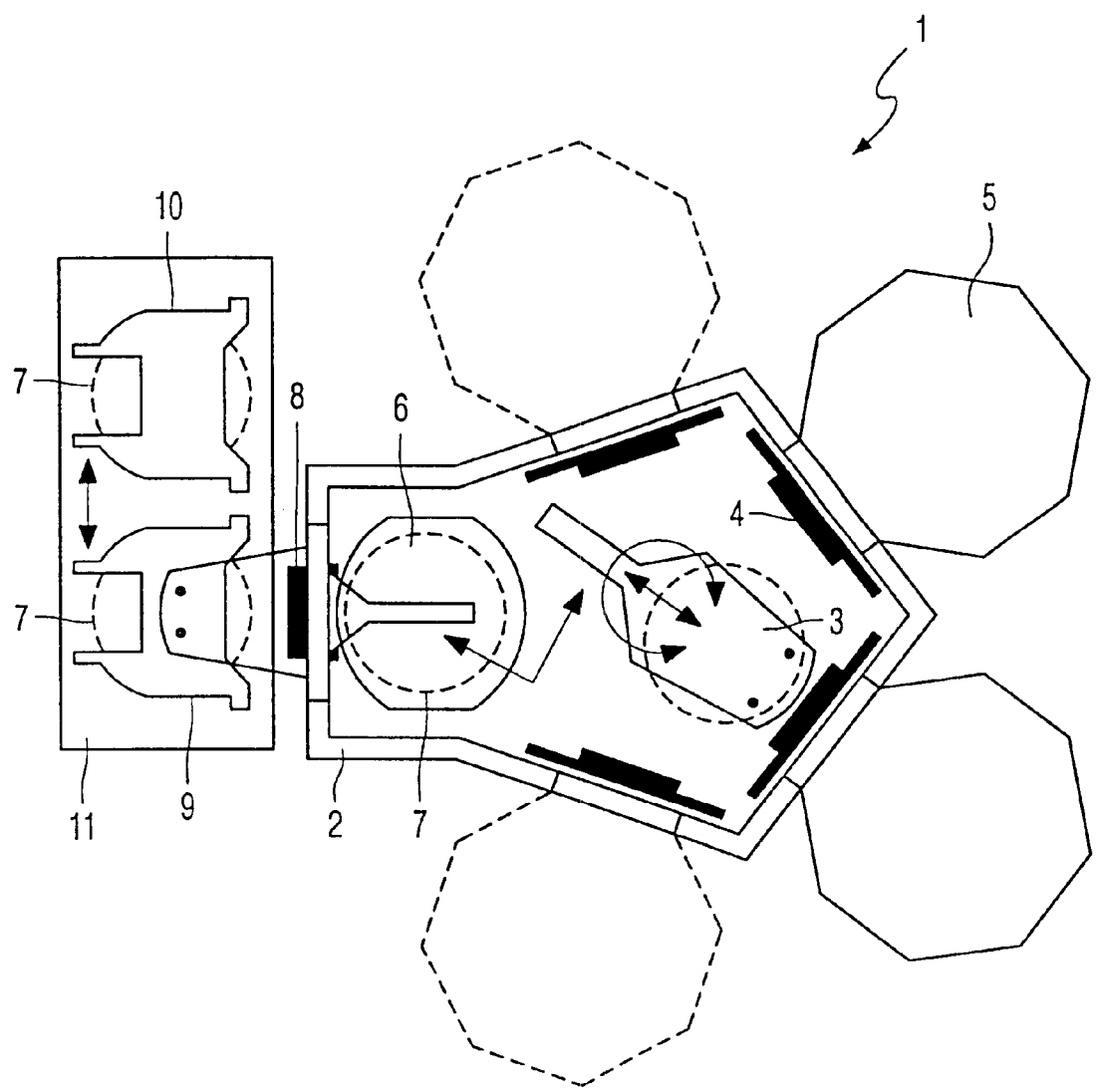
FIG. 1 shows a reactor for processing semiconductor slices (or wafers) as described in the preamble of claim 1.

The reactor shown in FIG. 1 is one which is also known, for example, from "Vakuumbeschichtung 2" by Uwe Behringer et al., VDI-Verlag Düsseldorf, 1995. The reactor 1 comprises a transport chamber 2 in which a transport robot 3 is present. The transport robot 3 is rotationally journaled and is capable of radial movements forward and back. Several process chambers 5 are coupled to the central transport chamber 2 via respective valves 4 and are arranged in a ring around the transport robot 3. In addition, an internal magazine 6 capable of holding several wafers 7 is mounted in a position in the ring around the center of rotation of the transport robot 3. The wafers 7 are deposited one above the other in the internal magazine 6, which can be moved vertically for this purpose by means of a lifting mechanism. Two additional, external magazines 9 and 10 for wafers 7 are coupled to the transport chamber 2 via a lock 8 behind the internal magazine 6 so that they lie in an external storage unit 11. The two magazines 9 and 10 also each comprise a lifting mechanism and can each hold several wafers 7. Magazine 9 or 10 can be moved to the lock 8 through a horizontal displacement of the storage unit 11, so that the transport robot 3 can grip the wafers 7 stored in the relevant magazine.

A vacuum atmosphere is maintained in the entire reactor 1 so that the wafers 7 under treatment do not come into contact with the outer atmosphere between process steps. The individual chambers are separated from one another by means of slot-shaped valves 4. One or several wafers 7 in the as yet unprocessed state (blanks) in a magazine are loaded into the external storage unit 11, which then forms a closed system with the reactor 1. The transport robot 3 can take the wafers 7 from the magazine 9 through the lock 8 which connects the storage unit 11 to the polygonal transport chamber 2. The transport robot 3 is for this purpose arranged with rotation possibility in the center of the transport chamber 1 and comprises a support on which a wafer 7 can be transported. By moving the support in longitudinal direction, the transport robot 3 takes a wafer 7 from the magazine 9 or the magazine 6. The wafer 7 is then laid in one of the process chambers 5 which are closed with a valve 4. In this manner different processes can take place simultaneously in the individual process chambers 5, and several wafers 7 can be processed. Preferably, the processes form part of one manufacturing step, so that the wafers 7 can be inserted consecutively into the relevant process chambers 5 without having to be exposed to the outer atmosphere in between. The wafers 7 are stored in the magazine 6 between the individual processes and not laid into magazine 9 until after the final process in this reactor 1. After all the wafers 7 from magazine 9 have been processed, the magazine 10 is moved to opposite the lock 8, and the first wafer 7 is taken therefrom for processing. It this position, it is possible to exchange the magazine 9 against a new magazine containing blanks.

Figure 2:
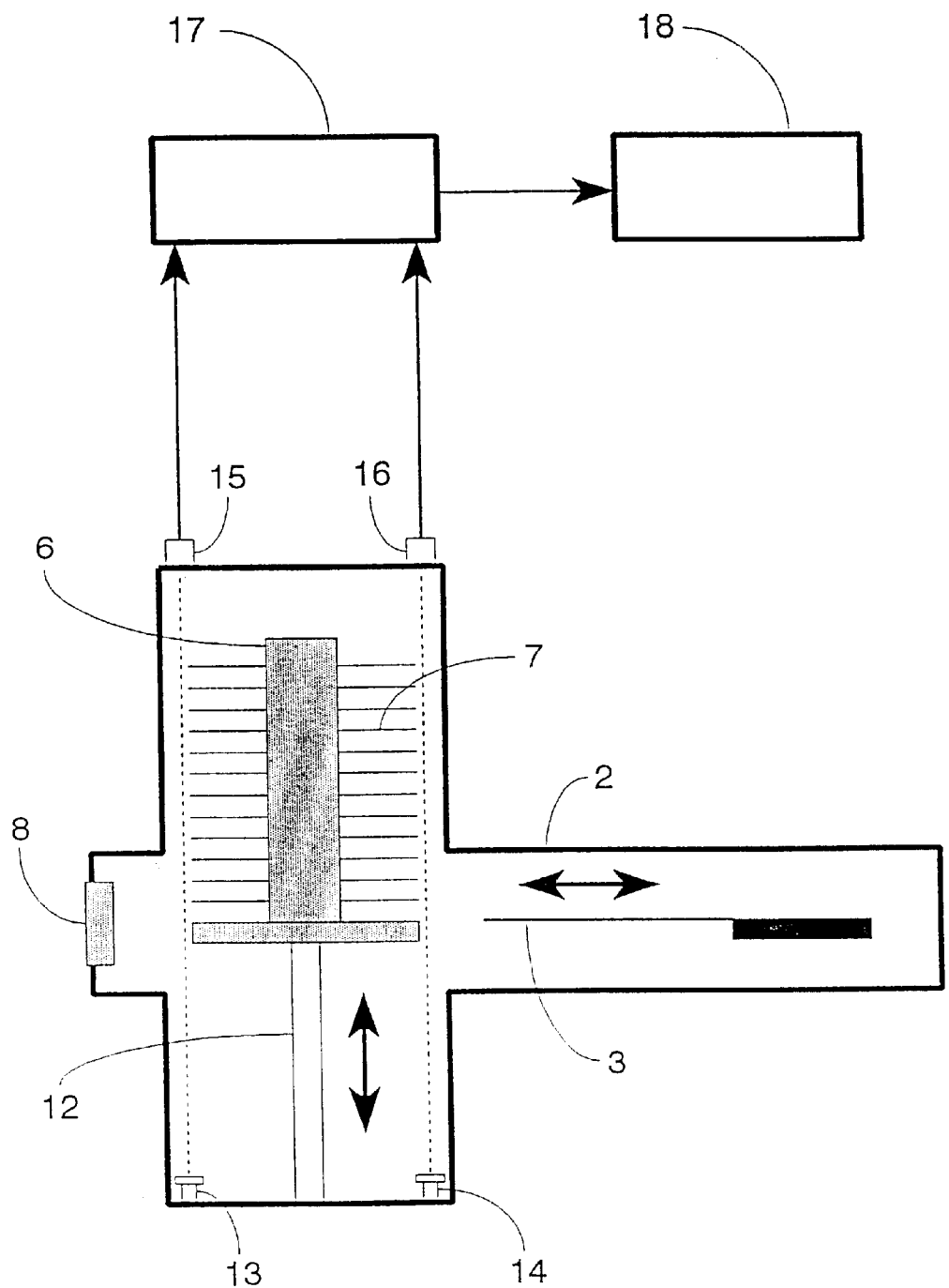
FIG. 2 is a diagram of a storage unit according to the invention with a magazine for wafers and a lifting mechanism, shown in cross-section.

FIG. 2 is a cross-sectional view showing the magazine 6 with its lifting mechanism 12, which magazine is present in the transport chamber 2. The lock 8 and the transport robot 3, which moves the wafers 7 into and from the magazine 6, are also shown. The transport robot 3 in FIG. 2 is in a return position in which the magazine 6 can be moved up and down for the supply of wafers 7. Two emitter diodes 13 and 14 are provided at the lower side of the reactor 1, each forming a photoelectric barrier with respective photodiodes 15 and 16 mounted to the upper side. A processing unit 17 and a control unit 18 of the reactor 1 are coupled thereto.

Since the light beam always extends parallel to the magazine 6, it will be interrupted by each and every wafer 7 irrespective of the size thereof when this wafer is shifted too far from its position. A too far displacement of a wafer 7 in the region of the lock 8 or the transport robot 3 does not cause any problems yet because of the larger diameter of the reactor 1. When the lifting mechanism 12 moves a wafer into a narrower range, however, damage may arise owing to a collision with the housing wall in the transitional range. The relevant wafer will be destroyed and will cause damage to other wafers in the magazine 6 owing to chipped fragments. A minimum distance to be observed by a shifted wafer 7 to the housing wall of the transport chamber 2 can be set by a suitable arrangement of the photoelectric barriers 13 to 16. When the minimum distance is exceeded in downward direction, the relevant photoelectric barrier switches to an alarm state and supplies a control signal which signalizes an interruption. The control signal is received by the processing unit 17 and processed. When the alarm state is triggered, and further information has been taken into account, a triggering signal is generated which causes the control unit 18 to stop the drive motors of the lifting mechanism 12 and the transport robot 3. A manual restart must be carried out, after the reactor 1 has been visually inspected. Further information describing the instantaneous process condition in the reactor 1 must be made available to the processing unit 17 because, for example, the transport robot 3 would otherwise also generate an alarm state when putting in or taking out a wafer 7. This is why a reaction follows an interruption of the photoelectric barriers 13 to 16 only while the transport robot 3 is in the return position. In addition, a warning lamp (not shown) on the processing unit 17 and/or the control unit 18 indicates the alarm state.

What is claimed is:

1. A reactor (1) for processing a plurality of wafers (7) comprising at least one process chamber (5), at least one transport chamber (2) with a transport robot (3) for the wafers (7), and at least two magazines, contained in an external storage unit, (6, 9, 10) for wafers (7) with a lifting mechanism (12), characterized in that an optical detection device (13, 14, 15, 16) is provided in the reactor (1) for monitoring the positions of all of the plurality of wafers (7) stored in the at least one magazine (6).

2. A reactor (1) as claimed in claim 1, characterized in that the optical detection device (13, 14, 15, 16) is so arranged as to enter an alarm state when a minimum distance to a housing wall surrounding the magazine (6) is exceeded in downward direction by at least one stored wafer (7).

3. A reactor (1) as claimed in claim 2, characterized in that at least one photoelectric barrier (13, 15; 14, 16) arranged parallel to the magazine (6) at the minimum distance to the housing wall lying closest to the magazine (6) is provided so as to form the optical detection device (13, 14, 15, 16).

4. A reactor (1) as claimed in claim 3, characterized in that a first photoelectric barrier (14, 16) is provided at a first side of the magazine (6), where the coupling to the transport chamber (2) is provided, and a second photoelectric barrier (13, 15) is provided at a second side of the magazine (6) where the coupling to a device for loading and unloading the reactor is positioned.

5. A reactor (1) as claimed in claim 4, characterized in that each photoelectric barrier (13, 15) consists of an emitter diode (13) which is mounted at the lower side of the reactor (1) and which emits a pulsed IR light beam and of a photodiode (15) designed for receiving the pulsed IR light beam and mounted at the upper side of the reactor (1).

6. A reactor (1) as claimed in claim 1, characterized in that a processing unit (17) is provided for receiving a control signal supplied by the optical detection device (13, 14, 16, 16) and characterizing the state thereof and for supplying at least one triggering signal to a control unit (18) of the reactor (1) in dependence on said control signal.

7. A reactor as claimed in claimed 1, wherein the external storage unit is configured for horizontal displacement.

* * * * *